United States Patent [19]

Knights et al.

[11] Patent Number: 5,238,741
[45] Date of Patent: Aug. 24, 1993

[54] SILICON CARBIDE FILAMENTS BEARING A CARBON LAYER AND A TITANIUM CARBIDE OR TITANIUM BORIDE LAYER

[75] Inventors: Clive F. Knights, West Hagbourne; John Cook, Blewbury; David S. Rickerby, Duffield, all of England

[73] Assignee: United Kingdom Atomic Energy Authority, London, United Kingdom

[21] Appl. No.: 913,999

[22] Filed: Jul. 17, 1992

Related U.S. Application Data

[63] Continuation of Ser. No. 599,228, Oct. 19, 1990.

[30] Foreign Application Priority Data

Oct. 19, 1989 [GB] United Kingdom ............ 8923588

[51] Int. Cl.$^5$ .............. B32B 9/00; C23C 16/30; C23C 16/50; C23C 14/38
[52] U.S. Cl. .................. 428/366; 427/569; 427/576; 427/577; 427/249; 427/250; 427/255.7; 204/192.1; 204/298.05; 204/298.26; 501/91; 501/95; 428/367; 428/368; 428/381; 428/386; 428/389; 428/408; 428/472; 428/698; 428/699; 428/704
[58] Field of Search .............. 427/249, 255.7, 38, 427/39, 250, 569, 576, 577; 428/366, 368, 367, 378, 379, 380, 381, 384, 386, 389, 689, 698, 699, 704, 457, 469, 472; 204/192.1, 192.31, 192.37, 298.26, 298.05; 501/91, 95

[56] References Cited

U.S. PATENT DOCUMENTS

| | | | |
|---|---|---|---|
| 3,811,920 | 5/1974 | Galasso et al. | 117/69 |
| 3,868,230 | 2/1975 | Krukonis | 29/198 |
| 3,985,917 | 10/1976 | Krukonis | 427/52 |
| 4,045,597 | 8/1977 | Debolt | 427/248 |
| 4,068,037 | 1/1978 | Debolt et al. | 428/368 |
| 4,123,583 | 10/1978 | Debolt | 428/336 |
| 4,127,659 | 11/1978 | Debolt | 427/249 |
| 4,142,008 | 2/1979 | Debolt | 427/249 |
| 4,315,968 | 2/1982 | Suplinskas et al. | 428/367 |
| 4,358,473 | 11/1982 | Debolt et al. | 427/10 |
| 4,415,609 | 11/1983 | Debolt | 427/249 |
| 4,481,257 | 11/1984 | Suplinskas et al. | 428/366 |
| 4,628,002 | 12/1986 | Suplinskas et al. | 428/367 |
| 4,686,117 | 8/1987 | Arai et al. | 427/249 |
| 4,702,960 | 10/1987 | Ogman | 428/367 |
| 4,724,169 | 2/1988 | Keem et al. | 427/249 |
| 4,889,686 | 12/1989 | Singh et al. | 419/13 |
| 4,898,778 | 2/1990 | Loszewski | 428/368 |
| 5,013,419 | 5/1991 | Rickerby et al. | 204/298.05 |
| 5,024,889 | 6/1991 | Loszewski | 428/368 |

FOREIGN PATENT DOCUMENTS

| | | |
|---|---|---|
| 1386551 | 3/1975 | United Kingdom . |
| 1478943 | 7/1977 | United Kingdom . |
| 1485896 | 9/1977 | United Kingdom . |
| 1560110 | 1/1980 | United Kingdom . |
| 1572460 | 7/1980 | United Kingdom . |
| 1579865 | 11/1980 | United Kingdom . |
| 2080781A | 2/1982 | United Kingdom . |

OTHER PUBLICATIONS

L. L. Chunikhina et al.: "Interaction of titanium alloys wih carbon-containing materials", (Translation into English of RR) Apr. 1991.

Chemical abstracts, vol. 98: 58345f, No. 8, Feb. 21, 1983 See QQ.

Coad, J. P. et al.: "Sputter-ion plating of coatings for protective of gas-turbine blades against high-temperature oxidation and corrosion." Metals Technology, vol. 9, Dec. 1982, London, GB, pp. 499-503.

*Primary Examiner*—Shrive Beck
*Assistant Examiner*—Bret Chen
*Attorney, Agent, or Firm*—Larson and Taylor

[57] ABSTRACT

Silicon carbide filaments are coated to protect them from attack by a titanium matrix material when incorporating them into a metal matrix composite. The coating method comprises coating the filaments firstly with a carbon layer and then with a titanium carbide or boride layer whose carbon or boron content decreases progressively from its interface with the carbon layer to its exterior surface. A layer of titanium or a titanium based alloy may be provided on the titanium carbide or boride layer to facilitate incorporation into a metal matrix. Preferably, the layers are applied by sputter ion plating.

11 Claims, 2 Drawing Sheets

SILICON CARBIDE FILAMENTS BEARING A CARBON LAYER AND A TITANIUM CARBIDE OR TITANIUM BORIDE LAYER

This application is a continuation of application Ser. No. 07/522,228 filed Oct. 19, 1990.

This invention relates to coating silicon carbide filaments in order to protect the filaments from attack by titanium matrix material.

A problem in making a metal matrix composite material in which filamentary silicon carbide is incorporated in a titanium or titanium based matrix arises from the fact that, under typical solid state metal matrix composite fabrication conditions (e.g. 925° C. for one hour), the silicon carbide and the titanium can react thereby degrading the strength of the filament and hence the composite.

One known way of treating silicon carbide filaments to assist their ability to be successfully incorporated within metallic matrices is described in U.S. Pat. No. 4 415 609. A carbon-rich silicon carbide layer is applied over stoichiometric silicon carbide whereby the ratio of silicon to carbon in the layer varies from one at the silicon carbide interface to near zero in its interior to greater than zero on its surface.

The present invention provides a different treatment of silicon carbide filaments that enables them to retain their strength when incorporated into a titanium or titanium based matrix.

Thus, in one aspect, the invention provides a method of coating a silicon carbide filament to protect the filament from attack by a titanium matrix material which comprises the steps of (i) coating the filament with a first carbon layer; and
(ii) coating the carbon layer with a second titanium carbide or titanium boride layer.

Optionally, a layer of titanium or a titanium based alloy may be provided on the titanium carbide or boride layer to facilitate incorporation of the filament into a titanium or titanium based matrix.

Also, the carbon or boron content of the titanium carbide or boride layer may be made to decrease progressively from its interface with the carbon layer to its exterior surface.

Filaments coated by the method of this invention have been found to maintain their strength when incorporated into a metal matrix in the production of a metal matrix composite as evidenced in the examples hereinafter. It is believed that the carbon layer controls overall adhesion to the filament and also provides material for reacting with titanium from the matrix to prevent it from reacting with the filament, and that the titanium carbide or boride layer acts as a diffusion barrier.

The method of applying the layers in the practice of the invention is important in order to provide a way of accommodating the difference in physical properties of the overall coating and the filament so that the coating remains intact and adherent during subsequent handling and processing. Further, the method has to be capable of providing the varying compositions of the layers, particularly in the titanium carbide or boride layer.

Sputter ion plating has been found to be a particularly suitable method for meeting the above requirements. It is a method comprising transfer of material from a cathode to a substrate in the presence of a DC glow discharge in a soft vacuum chamber wherein the material is generated from the cathode by the action of ion bombardment, i.e. sputtering, and ultimately diffuses to the substrate to form a coating thereon. Sputter ion plating is described in detail in a number of references in the art, for example in Metals Technology 1982, 9, 499 by J. P. Coad and J. E. Restall, and NATO Advanced Workshop on 'Coatings for Heat Engines', Acquafredda di Maratea, Italy, April 1984 by J. P. Coad and D. S. Rickerby.

In the use of sputter ion plating in the practice of the invention, the substrate is the silicon carbide filament or filaments to be coated and the cathode is made of the coating material or material capable of reacting under the conditions of the sputter ion plating to form the coating material. Thus, where the layer in step (ii) is a titanium carbide layer, the cathode may comprise one or more titanium cathodes and one or more carbon cathodes so that conditions may be controlled to provide, in sequence, the carbon layer of step (i) of the present method, the titanium carbide layer of step (ii) thereof, and the optional titanium or titanium based alloy layer. For example, where the cathode comprises both titanium and carbon cathodes, initially the carbon cathode(s) only are bombarded to produce the carbon layer on the filament. Then, both titanium and carbon cathodes are firstly bombarded at an energy level suitable to produce a carbon-rich titanium carbide layer and the carbon cathode(s) subsequently bombarded at a progressively lower energy to produce the titanium carbide layer where the carbon content becomes progressively lower with increased distance from the filament. Finally, the titanium cathode(s) only are bombarded to produce the titanium layer, if required.

Sputter ion plating has the particular advantage in the practice of this invention of enabling the surfaces of the filament to be cleaned by sputter ion bombardment immediately before they are coated. Also, the density and stresses in the coating can be adjusted by applying appropriate bias voltages to the silicon carbide filament substrate. Sputter ion plating, being a low temperature process (e.g. 600° C.), is well suited for controlling stresses formed when coating.

Coating methods other than sputter ion plating may be used in the practice of the invention such as plasma activated chemical vapour deposition and on-line chemical vapour deposition.

In another aspect, the invention provides a silicon carbide filament having a coating for protecting the filament from attack by a titanium matrix material, which coating comprises a carbon first layer adjacent the filament and a titanium carbide or titanium boride second layer on the carbon layer. The carbon content of the titanium carbide layer or boron content of the titanium boride layer may decrease progressively from its interface with the carbon layer to its exterior surface. Optionally, the titanium carbide or boride layer carries a titanium or titanium based alloy layer.

The thickness of the coating, its microstructure and those of the constituent layers thereof is determined by functional requirements. For example, the thickness of the carbon layer has to be such as to maintain the stability of the silicon carbide filament when it is incorporated into a metal matrix. The total thickness of the coating (including the matrix layer) may, for example be up to about 50 micrometres.

Silicon carbon filaments according to this invention may be incorporated into a metal matrix by methods known in the art, for example by solid state routes such as hot pressing or hot isostatic pressing.

BRIEF DESCRIPTION OF THE DRAWINGS

One way of carrying out the invention will now be particularly described, by way of example only, as follows. Reference will be made to the accompanying drawings wherein:

Referring to FIG. 1 and FIG. 2, an earthed cylindrical coating chamber 1 is provided with an externally mounted resistance heater 2 having a cooling jacket 3. The coating chamber 1 has a gas inlet vent 4 with an associated baffle 5 and has gas outlet vents 6 with associated baffles 7. The inlet vent 4 communicates with a getter chamber 8 provided with an inlet conduit 9 and the outlet vents 6 communicate with a pumping chamber 10 provided with a pumping port 11.

Figure 1:
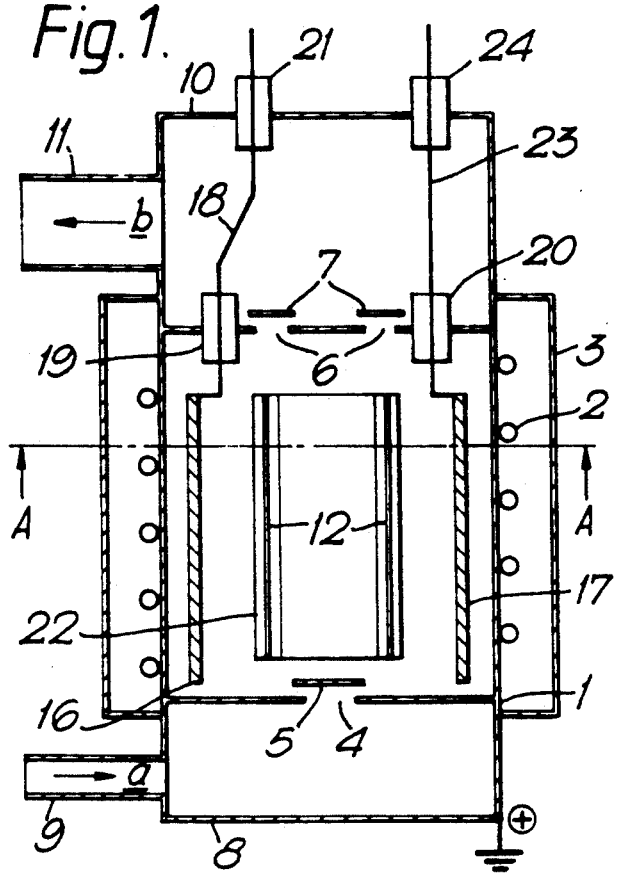
FIG. 1 a schematic diagram of an apparatus for coating b ion plating.

A substrate 12 is in the form of a ring of silicon carbide monofilaments mounted coaxially in an annular specimen holder 22 in the coating chamber 1. The substrate 12 is electrically connected to a bias potential power supply (not shown) and is provided with a means for rotation to ensure that, in operation, all of the silicon carbide monofilaments are coated homogeneously.

A cathode in the form of three rectangular titanium target plates 16 and three rectangular graphite target plates 17 is mounted within the coating chamber 1. The target plates 16 and 17 are in an hexagonal array in which the titanium plates 16 and the graphite plates 17 alternate. The titanium plates 16 are electrically connected to a first cathode power supply (not shown) by a conductor 18 mounted in insulators 19 and 21, and the graphite plates 17 electrically connected to a second cathode power supply (not shown), independent of the first power supply, by a conductor 23 mounted in insulators 20 and 24.

Figure 2:
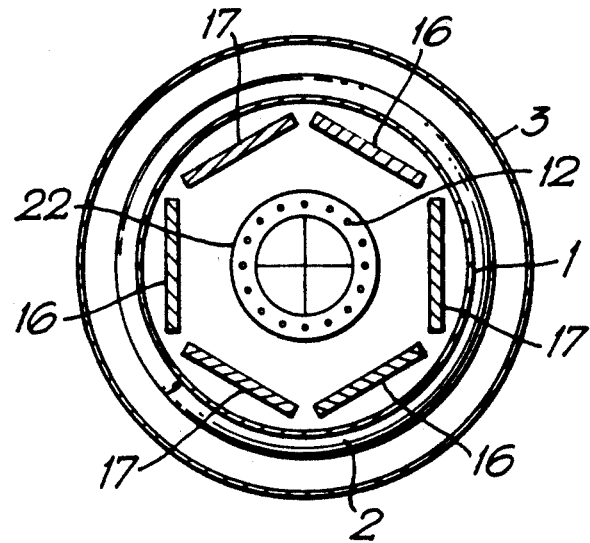
FIG. 2 is a schematic section on the line A—A of FIG. 1.

In operation of the apparatus shown in FIGS. 1 and 2, an operating gas is supplied at the inlet conduit 9 and, by operation of a pump (not shown) at the pumping port 11, is drawn into the getter chamber 8 as shown by arrow $a$ and thence into the coating chamber 1 via inlet vent 4. The coating chamber 1 is heated by means of the heater 2 in order to outgas the substrate 12, cathode 16 and 17 and evaporate any organic material. Undesired gas and vapour leave the coating chamber 1 via the outlet vents 6 to enter the pumping chamber 10 and are removed via the pumping port 11 as shown by arrow $b$. A high negative voltage is applied to the target plates 16 and 17 by means of the first and second cathode power supplies (not shown) to produce a glow discharge with net transfer of cathode material therefrom by sputtering onto the substrate 12 to provide a coating thereon. External heating is not required at this stage since the process generates sufficient power to maintain the operating temperature.

If desired, the apparatus shown in FIGS. 1 and 2 may be provided with an additional chamber situated between the coating chamber 1 and the getter chamber 8. The additional chamber is also provided with a cathode comprising an hexagonal array of rectangular plates but of a material different from the plates 16 and 17 of FIGS. 1 and 2. The cathode of the additional chamber is electrically connected to a cathode power supply that is independent of the cathode power supply (not shown) of FIGS. 1 and 2.

In operation of the apparatus shown in FIGS. 1 and 2 provided with the above-described additional chamber, the substrate 12, having been first coated in the coating chamber 1, is lowered into the additional chamber and coated by sputter ion plating under conditions analogous to those used to provide the coating in the coating chamber 1.

EXAMPLE

Coating of Silicon Carbide Monofilaments

The coating chamber 1 of the apparatus shown in FIGS. 1 and 2, loaded with silicon carbide monofilaments, was pumped down to 10–100 m torr pressure and flushed with a high purity argon atmosphere. The pressure was adjusted to $6 \times 10^{-2}$ torr and the getter chamber 8 turned on. The monofilaments were rotated in the specimen holder 22 and the coating chamber 1 preheated to 500° C. by means of the heater 2. The heater 2 was then turned off.

The gas pressure in the coating chamber 1 was adjusted to 0.1 torr and the monofilament surfaces ion cleaned for 7 minutes at 500 volts and 220 mA. The monofilaments were then coated with a carbon layer over a period of 45 minutes by sputter ion plating by applying 1.25 kW to the graphite plates 17, adjusting the gas pressure in the coating chamber 1 to $6.5 \times 10^{-2}$ torr and applying a bias voltage of $-45$ volts to the monofilaments.

The monofilaments were then coated with a titanium carbide layer of graded composition over a period of 45 minutes by sputter ion plating: initially the titanium plates 16 were provided with a nominal power level setting of 3 kW and the graphite plates 17 with a voltage setting of 900 volts, the gas pressure in the coating chamber 1 being maintained at $6.2 \times 10^{-2}$ torr and the bias voltage setting to the monofilaments being $-45$ volts; and the voltage setting on the graphite plates 17 was turned down in 100 volt steps every 5 minutes. Thus, the carbon content of the titanium carbide layer decreased progressively from its interface with the carbon layer to its exterior surface.

The coated monofilaments in their specimen holder 22 were lowered into an additional coating chamber as described above wherein the rectangular plates of the cathode were of a titanium based alloy of composition Ti-Al-4V (by weight). A further layer—of the titanium based alloy—was applied to the monofilaments by sputter ion plating using a nominal power level setting to the plates of 3 kW, a gas pressure of $6 \times 10^{-2}$ torr and a bias voltage setting to the monofilaments of $-20$ volts.

Figure 3:
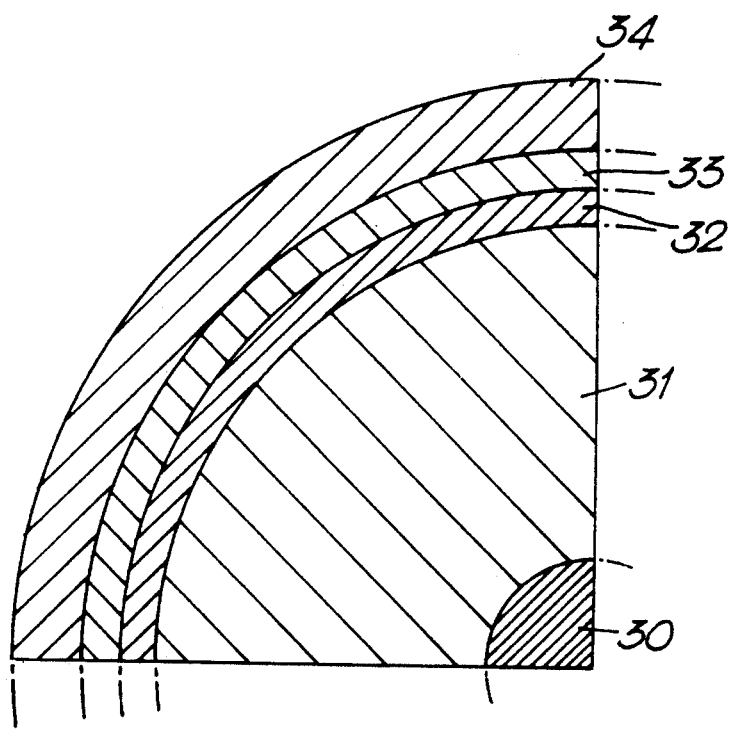
FIG. 3 is a schematic section of a quadrant of a monofilament coated according to the present invention.

The resulting coating is shown in FIG. 3 wherein the reference numerals indicate the following:

| | |
|---|---|
| 30 | tungsten wire substrate for monofilament |
| 31 | main body of silicon carbide monofilament |
| 32 | layer of pure carbon |
| 33 | layer of titanium carbide of graded stoichiometry |
| 34 | layer of titanium based alloy |

The thickness of the total coating, i.e. consisting of layers 32, 33 and 34, was between 45 and 50 micrometres.

Testing of Coated Silicon Carbide Monofilaments

Coated monofilaments, prepared as described above, were found in standard tests to have a mean tensile strength of 1.6 GPa with a nominal monofilament volume fraction of 0.25. The coated monofilaments were then heat treated under vacuum at 925° C. for 1 hour to simulate a fabrication thermal cycle and their mean tensile strength redetermined. A value of 1.7 GPa was obtained, thus indicating that the heat treatment had not caused any loss of strength.

By way of comparison, silicon carbide monofilaments were coated by sputter ion plating with a layer of the titanium based alloy only; i.e., layers of pure carbon and of titanium carbide were not applied. After heat treatment under the above described conititions, the coated monofilaments were found to have a mean tensile strength of 0.89 GPa with a nominal monofilament volume fraction of 0.26. Thus, the provision of the intermediate carbon and titanium carbide layers had improved the mean tensile strength by greater than 80% following the heat treatment.

The coating of the silicon carbide fibre also may be carried out by the process known as chemical vapour deposition. Such processes are well known in the chemical art. In a typical process, a heated filament or lamina to be coated is continuously passed through a deposition chamber containing gases which on contact with the hot filament deposit the desired coating.

In the present case, the filament is caused to pass from a feed spool to a receiving spool via a tubular reaction chamber. The fibre enters and leaves the reaction chamber through liquid metal electrodes at the ends of the reaction chamber. The electrodes form part of an electric heating circuit which provides current to the filament, so heating the filament to the desired temperature. The deposition gas, or gases, which may be mixed with an inert carrier gas are fed into the reaction chamber at one end and removed at the other. Preferably the deposition gas flows counter-current to the direction of motion of the fibre.

We claim:

1. A method of coating a silicon carbide filament to protect the filament from attack by a titanium matrix material, comprising the operations of coating the filament directly with a first layer of carbon and coating the layer of carbon directly with a layer of titanium carbide or titanium boride in such a manner that the carbon or boron content of the second layer decreases progressively from the interface between the first and second layers to the exterior surface of the second layer.

2. A method according to claim 1 including the further step of depositing a third layer of titanium or a titanium based alloy upon the second layer.

3. A method according to claim 2 wherein the layers are deposited by a vacuum deposition process.

4. A method according to claim 3 wherein the vacuum deposition process is plasma activated vapour deposition.

5. A method according to claim 3 wherein the vacuum deposition process is sputter ion plating.

6. A method according to claim 5 wherein the silicon carbide filament is placed in a holder within a cathode comprising a cylindrical array of plates of titanium and carbon or boron disposed alternately and connected to independent electrical power supplies the holder being connected to another source of electrical power and both holder and cathode being in a vacuum chamber, the vacuum chamber is evacuated, an operating gas is admitted to the chamber, a bias potential is applied to the holder, a bias potential is applied to the plates of carbon or boron sufficient to create a glow discharge in their vicinity and the transfer of material from them to the silicon carbide filament by sputtering thereby to create the first layer of carbon or boron on the surface of the silicon carbide filament, and a similar potential is then applied to the titanium plates also so as to transfer titanium to the silicon carbide filament and form the second layer of titanium carbide or boride thereon.

7. A method according to claim 6 wherein the potential applied to the plates of carbon or boron is progressively reduced thereby to vary similarly the constitution of the second layer.

8. A method according to claim 6 wherein a third layer is deposited in the same manner as the first or second layers by means of a cathode assembly comprising a cylindrical array of plates of the material or materials required to deposit the said layer.

9. A method according to claim 8 wherein the third layer is titanium and the titanium plates used to form the second layer are utilised, no potential being applied to the plates of carbon or boron.

10. A silicon carbide filament having a coating for protecting the filament from attack by a titanium matrix material, which coating comprises a first layer consisting essentially of carbon adjacent the filament and a titanium carbide or boride second layer on the carbon first layer, the carbon or boron content of the second layer decreasing progressively throughout the second layer from a maximum at the interface between the first and second layers to a minimum at the exterior of the second layer.

11. A silicon carbide filament according to claim 10 having a titanium or titanium alloy third layer deposited upon the second layer.

* * * * *